United States Patent
Gu et al.

(10) Patent No.: US 10,097,190 B2
(45) Date of Patent: Oct. 9, 2018

(54) WIDE CAPTURE RANGE REFERENCE-LESS FREQUENCY DETECTOR

(71) Applicant: Futurewei Technologies, Inc., Plano, TX (US)

(72) Inventors: Liang Gu, Santa Clara, CA (US);
Yuming Cao, Santa Clara, CA (US);
Yen Dang, Santa Clara, CA (US); Gong Lei, Santa Clara, CA (US); Yifan Gu, Santa Clara, CA (US); Hung-Yi Lee, Santa Clara, CA (US); Mamatha Deshpande, Santa Clara, CA (US); Shou-Po Shih, Santa Clara, CA (US); Miao Liu, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/394,506

(22) Filed: Dec. 29, 2016

(65) Prior Publication Data

US 2018/0175865 A1 Jun. 21, 2018

Related U.S. Application Data

(60) Provisional application No. 62/436,200, filed on Dec. 19, 2016.

(51) Int. Cl.
*H04L 7/00* (2006.01)
*H03L 7/089* (2006.01)
(Continued)

(52) U.S. Cl.
CPC ............ *H03L 7/0891* (2013.01); *G05F 1/561* (2013.01); *H03L 7/0807* (2013.01); *H03L 7/099* (2013.01)

(58) Field of Classification Search
CPC ... H04L 7/0337; H04L 7/0334; H04L 7/0331; H04L 7/0016; H04L 7/0807; H03L 7/091; H03L 7/0891
(Continued)

(56) References Cited

U.S. PATENT DOCUMENTS

2012/0313715 A1 12/2012 Kargar et al.
2016/0350455 A1* 12/2016 Zhou ................... G06F 17/5009
(Continued)

OTHER PUBLICATIONS

Lee, JRI, et al., "A 20-Gb/s Full-Rate Linear Clock and Data Recovery Circuit With Automatic Frequency Acquisition", *IEEE Journal of Solid-State Circuits*, vol. 44, Issue 12, (Dec. 2009), 3590-3602.

*Primary Examiner* — Khai Tran
(74) *Attorney, Agent, or Firm* — Schwegman Lundberg & Woessner, P.A.

(57) ABSTRACT

A reference-less frequency detector circuit includes a sampling circuit that is configured to generate a frequency control voltage and a switch circuit control signal based on a frequency difference between a clock signal frequency and an input data rate. The frequency control voltage has a frequency down indication and a frequency up indication. A voltage-to-current converter circuit is coupled to the sampling circuit and is configured to convert the frequency control voltage to a frequency control current based on the switch circuit control signal. The voltage-to-current converter circuit includes an output switch circuit controlled by the switch control signal and is configured to have substantially equal respective latencies for the frequency down indication and the frequency up indication.

20 Claims, 5 Drawing Sheets

(51) Int. Cl.
  *G05F 1/56*   (2006.01)
  *H03L 7/08*   (2006.01)
  *H03L 7/099*  (2006.01)

(58) Field of Classification Search
  USPC .... 375/355, 334, 354, 371, 376; 331/14, 17, 331/34; 327/3, 12, 47, 147; 455/103, 455/127, 307, 325
  See application file for complete search history.

(56) References Cited

U.S. PATENT DOCUMENTS

2017/0099058 A1* 4/2017 Josefsberg ............... H03L 7/085
2017/0126236 A1* 5/2017 Gu ........................... H03L 7/099

* cited by examiner

WIDE CAPTURE RANGE REFERENCE-LESS FREQUENCY DETECTOR

FIELD OF THE INVENTION

This application claims the benefit of priority under 35 U.S.C. § 119(e) to U.S. Provisional Patent Application Ser. No. 62/436,200, filed on Dec. 19, 2016, which is hereby incorporated by reference herein in its entirety.

FIELD OF THE INVENTION

The present disclosure is related to frequency detectors and, in particular, to reference-less frequency detectors.

BACKGROUND

A conventional clock/data recovery (CDR) uses a reference clock in order to bring the voltage controlled oscillator (VCO) output frequency into the vicinity of the data rate before phase acquisition. In certain applications, such as power and/or area limited circuits, a reference clock may not be present or may be difficult to route to the CDR. Accordingly, reference-less CDRs may be used in such situations.

However, in frequency detector (FD) of reference-less CDRs, the latency of frequency down control signals is much larger than the latency of frequency up control signals due to asymmetrical architecture within the frequency detector. Thus, when the input data rate is much lower than the VCO frequency, the frequency detector cannot reduce the VCO's frequency low enough to match the input data rate. Thus, the frequency cannot lock to the data rate and the data may be lost.

SUMMARY

Various examples are now described to introduce a selection of concepts in a simplified form that are further described below in the detailed description. The summary is not intended to identify key or essential features of the claimed subject matter, nor is it intended to be used to limit the scope of the claimed subject matter.

A reference-less frequency detector circuit including a sampling circuit configured to generate a frequency control voltage and a switch circuit control signal based on a frequency difference between a clock signal frequency and an input data rate, the frequency control voltage comprising a frequency down indication and a frequency up indication. A voltage-to-current converter circuit is coupled to the sampling circuit and configured to convert the frequency control voltage to a frequency control current based on the switch circuit control signal, the voltage-to-current converter circuit comprising an output switch circuit controlled by the switch control signal and configured to have substantially equal respective latencies for the frequency down indication and the frequency up indication.

A clock/data recovery system includes a voltage controlled oscillator configured to generate a clock signal. A phase detector is coupled to the voltage controlled oscillator and configured to generate a buffered data signal, and a phase difference control signal based on an input data signal and the clock signal, wherein the phase difference control signal is indicative of a phase difference between the clock signal and the input data signal. A reference-less frequency detector coupled to the voltage controlled oscillator and configured to generate a frequency difference control signal indicative of a frequency difference between the input data signal and the clock signal. The frequency detector includes sampling circuit configured to generate a frequency control voltage and a switch circuit control signal based on the frequency difference between the clock signal and the input data signal, the frequency control voltage comprising a frequency down indication and a frequency up indication. A voltage-to-current converter circuit is coupled to the sampling circuit and configured to convert the frequency control voltage to a frequency control current in response to the switch circuit control signal, the voltage-to-current converter circuit comprising an output switch circuit controlled by the switch control signal and configured to have substantially equal respective latencies for the frequency down indication and the frequency up indication. A filter is coupled to the phase detector and the frequency detector and configured to output a control signal to the voltage controlled oscillator, wherein the control signal provides an indication of a phase difference and a frequency difference between the input data signal and the clock signal.

A method for generating a frequency control signal from a reference-less frequency detector includes generating an up/down control voltage, wherein the up/down control voltage is indicative of a frequency difference between an input data rate and a clock frequency and comprises an up frequency indication voltage and a down frequency indication voltage. An on/off control signal is generated based on the data rate and the clock frequency. The frequency control current is generated based on the up and down control voltages and the on/off control signal, wherein the on/off control signal controls an output switch circuit of a voltage-to-current converter circuit such that a latency of the up frequency indication voltage is equal to a latency of the down frequency indication voltage through the output switch circuit.

DETAILED DESCRIPTION

Some of the challenges noted above, as well as others, can be addressed by implementing the reference-less frequency detector having an output switch circuit. The output switch circuit includes a symmetrical architecture that provides equal respective latencies for both a frequency down indication as well as a frequency up indication for a VCO circuit. The VCO control signal latency is also reduced as compared to conventional frequency detector circuits.

Figure 1:
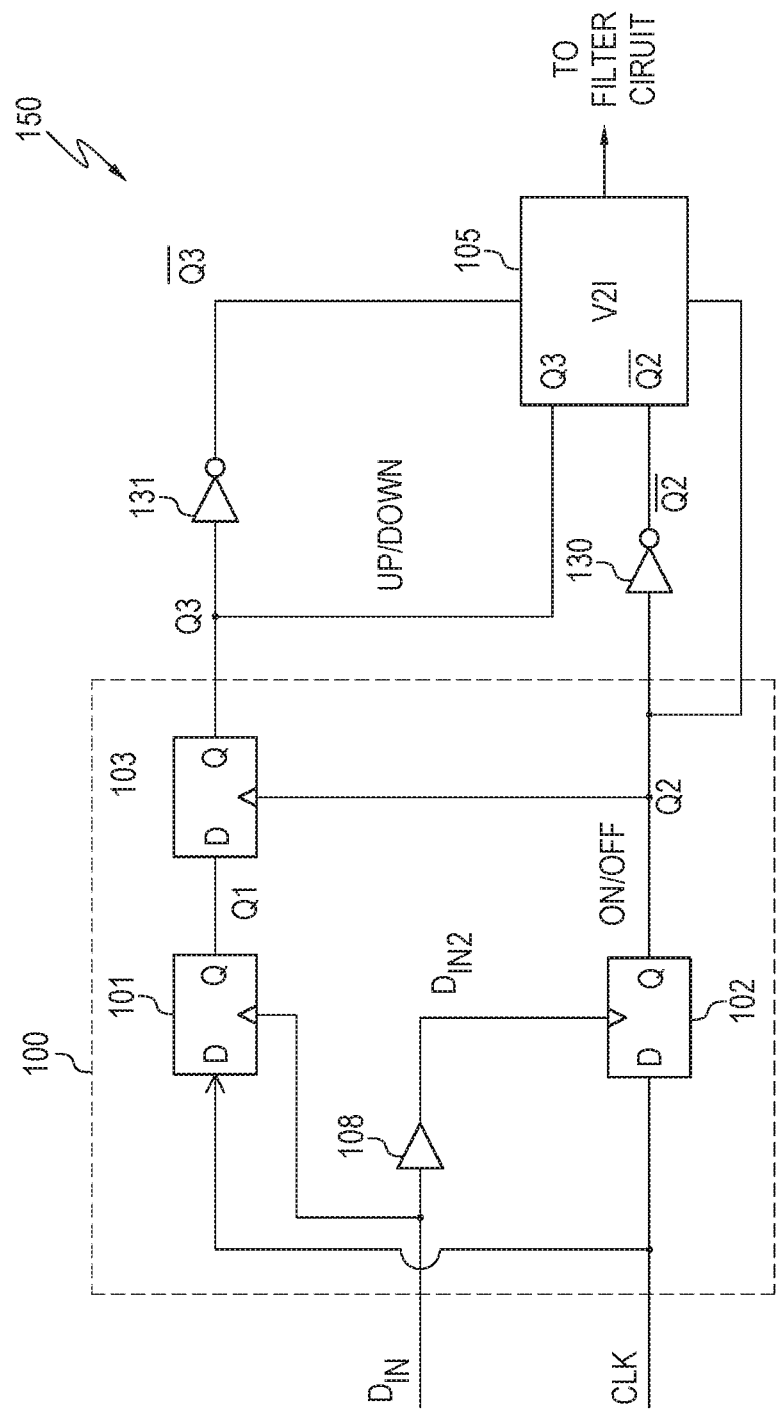
FIG. 1 illustrates a block diagram of a reference-less frequency detector, according to various embodiments.

FIG. 1 illustrates a reference-less frequency detector 150, according to various embodiments. The frequency detector 150 includes a sampling circuit 100 coupled to a voltage-to-current converter circuit 105.

The sampling circuit 100 includes flip-flops 101, 102, 103 (e.g., D flip-flops). A data signal $D_{IN}$ and a clock signal CLK are input to the sampling circuit 100. The sampling circuit generates a frequency control signal and a switch circuit control signal based on a frequency difference between the clock signal CLK and data signal $D_{IN}$.

In an embodiment, the sampling circuit 100 shows a delay cell 108 whose delay time is ¼ of a bit time. However, the delay cell 108 is used for illustrating that $D_{IN}$ has a delayed version, $D_{IN2}$. In other words, the $D_{IN2}$ signal is a delayed version of the $D_{IN}$ signal. The $D_{IN2}$ signal is coupled to the clock input of one flip-flop 102 while the $D_{IN}$ signal is coupled to the clock input of another flip-flop 101.

The CLK signal may be input from a voltage controlled oscillator (VCO), as described subsequently. Other embodiments may input the clock signal CLK from other clock generation circuits.

The $D_{IN}$ signal and the CLK signal are provided as the clock input and the data input, respectively, of D flip-flop 101. $D_{IN2}$ and the CLK signal are provided as the clock input and the data input, respectively, of D flip-flop 102.

D flip-flop 102 samples the CLK signal at the rising edges of the $D_{IN2}$ signal to generate an output signal Q2. D flip-flop 101 samples the CLK signal at the rising edges of the $D_{IN}$ signal to generate an output signal Q1.

The period of signals Q1 and Q2 are substantially equal and proportional (e.g., inversely proportional) to the frequency difference between the $D_{IN}$ signal and CLK signal. Signals Q1 and Q2 contain information regarding the frequency difference between the $D_{IN}$ signal and CLK signal. Specifically, when signal Q2 leads signal Q1, the CLK signal has a higher frequency than the $D_{IN}$ signal. When signal Q2 lags signal Q1, the CLK signal has a lower frequency than the $D_{IN}$ signal.

Signal Q3 indicates which of signals Q1 and Q2 leads the other. In particular, when signal Q2 leads signal Q1, signal Q3 is a logic low indicating that the frequency of the CLK signal is higher than the frequency of the $D_{IN}$ signal. The logic low indicates to the VCO that it needs to decrease its clock frequency to match the data frequency (e.g., frequency down indication). On the other hand, when signal Q2 lags signal Q1, signal Q3 is a logic high indicating that the frequency of the CLK signal is lower than the frequency of the $D_{IN}$ signal. The logic high indicates to the VCO that it needs to increase its clock frequency to match the data frequency (e.g., frequency up indication). Thus, signal Q3 may be referred to as an up or down control voltage, depending on the signal state, or frequency control signal since, when converted to a frequency control current (e.g., an up/down current signal) by the voltage-to-current converter circuit 105, it may be used by the voltage controlled oscillator to know when to increase its frequency (i.e., up) or decrease its frequency (e.g., down) to correspond to the frequency of the input data.

Signal Q2 may be referred to as an on/off signal or switch circuit control signal. This signal is used to turn on or off an output switch circuit in the voltage-to-current converter circuit 105, as described subsequently with reference to FIG. 2.

Signals $\overline{Q_2}$ and $\overline{Q_3}$ are used in the voltage-to-current converter circuit 105 so inverters 130, 131 are used to generate these signals from their respective complementary signals Q2 and Q3. Voltage-to-current converter circuit 105 is coupled to the output of the D flip-flop 103, the output of the D flip-flop 102, the output of inverter 130, and the output of inverter 131. In an embodiment, the output of the voltage-to-current converter circuit 105 (e.g., up/down current signal) is input to a filter circuit, as described subsequently with reference to FIG. 4.

Figure 2:
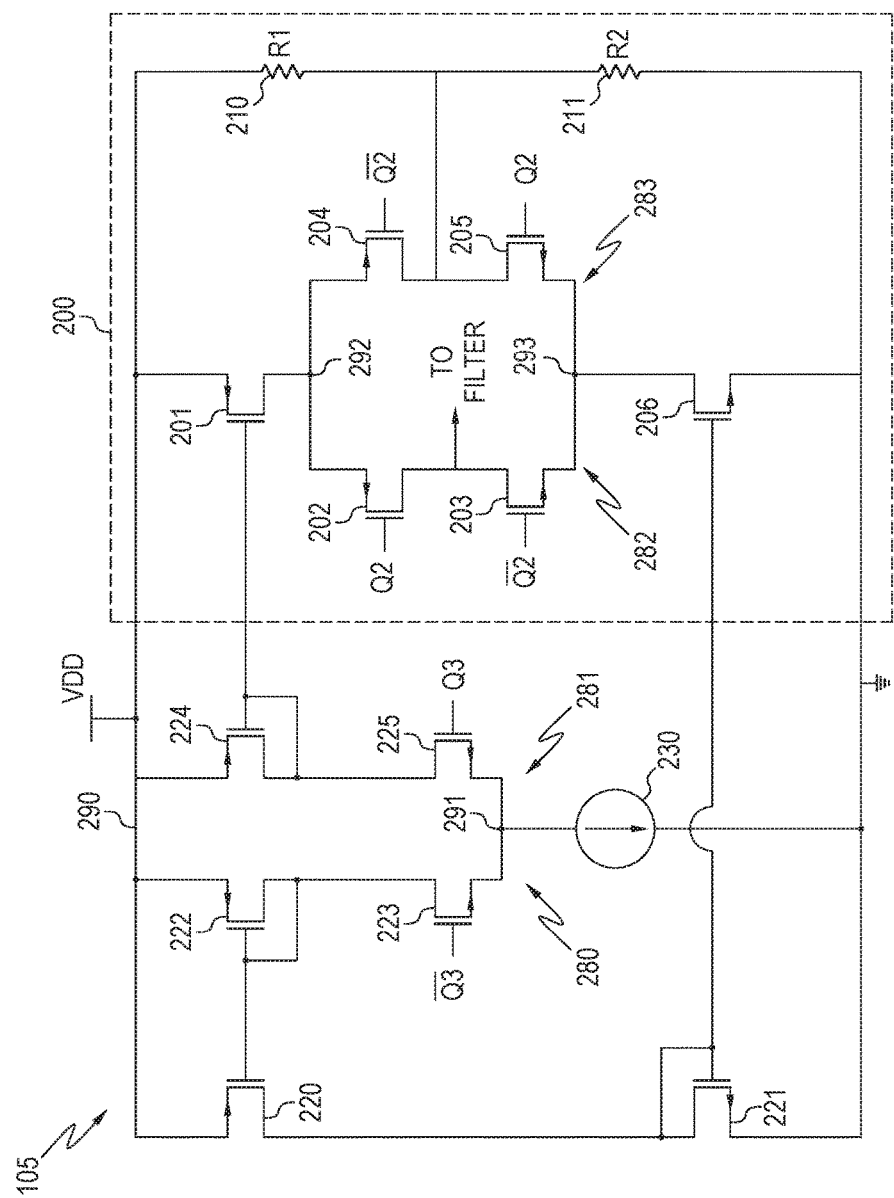
FIG. 2 illustrates a schematic diagram of a voltage-to-current converter circuit, according to the embodiment of FIG. 1.

FIG. 2 illustrates a schematic diagram of a voltage-to-current converter circuit 105, according to the embodiment of FIG. 1. The schematic diagram shows one implementation of the voltage-to-current converter circuit 105. This circuit 105 includes the output switch circuit 200.

The circuit 105 includes two series circuits 280, 281. Each series circuit 280, 281 includes respective first and second transistors 222, 223, 224, 225 coupled in series (e.g., drain-to-drain) with each other and being of complementary type with each other. For example, transistor 222 may be a p-type transistor (e.g., PFET) while transistor 223 may be an n-type transistor (e.g., NFET). Similarly, transistor 224 may be a p-type transistor (e.g., PFET) while transistor 225 may be an n-type transistor (e.g., NFET). The two series circuits 280, 281 are coupled together in parallel at first and second common nodes 290, 291 such that transistors 222, 224 have their sources coupled to the first common node 290 and transistors 223, 225 have their sources coupled to the second common node 291.

The first common node 290 is coupled to a supply voltage node that may be powered to $V_{DD}$ during circuit operation. The second common node 291 is coupled to a current source 230 that is also coupled to a circuit reference voltage node (e.g., circuit ground).

Transistor 222 and transistor 224 are coupled in a diode configuration. In other words, their control gates are coupled to their respective drain nodes. Thus, these transistors 222, 224 provide a diode voltage drop in the circuit during circuit operation.

The control gate of transistor 223 is coupled to and controlled by signal $\overline{Q_3}$ such that the transistor 223 turns on and conducts when $Q_3$ is low. The control gate of transistor 225 is coupled to and controlled by signal $Q_3$ such that the transistor 225 turns on and conducts when $Q_3$ is high.

Transistors 220 and 221 are coupled in series (e.g., drain-to-drain) between the supply voltage node and the circuit reference voltage node. The source of transistor 220 is coupled to the supply voltage node and the source of transistor 221 is coupled to the circuit reference voltage node. The control gate of transistor 220 is coupled to the control gate of transistor 222. The control gate of transistor 221 is coupled to a control gate of transistor 206 in the output switch circuit 200. Transistor 221 is also coupled in a diode configuration (e.g., control gate coupled to drain) so that it provides a diode voltage drop during circuit operation.

The output switch circuit 200 includes two series circuits 282, 283. Each series circuit 282, 283 includes respective first and second transistors 202, 203, 204, 205 coupled in series (e.g., drain-to-drain) with each other and being of complementary type with each other. For example, transistor 202 may be a p-type field effect transistor (e.g., PFET) while transistor 203 may be an n-type transistor (e.g., NFET). Similarly, transistor 204 may be a p-type transistor (e.g., PFET) while transistor 205 may be an n-type transistor (e.g., NFET). The two series circuits 282, 283 are coupled together in parallel at first and second common nodes 292, 293 such that transistors 202, 204 have their sources coupled to the first common node 292 and transistors 203, 205 have their sources coupled to the second common node 293.

The first common node 292 is coupled the drain of transistor 201 whose source is coupled to the supply voltage node that may be powered to $V_{DD}$ during circuit operation. The second common node 293 is coupled to the drain of transistor 206 whose source is coupled to the circuit reference voltage node (e.g., circuit ground). The control gate of transistor 201 is coupled to the control gate of transistor 224. The control gate of transistor 206 is coupled to the control gate of transistor 221.

Signal Q2 is coupled to the control gates of transistors 202, 205. Signal $\overline{Q_2}$ is coupled to the control gates of transistors 203, 204. A common node between transistor 202 and 203 is the output of the voltage-to-current converter circuit 105. A common node between transistor 204 and transistor 205 is coupled to a voltage divider circuit formed by resistances R1 210 and R2 211. The resistance R1 210 is also coupled to the power supply node while the resistance R2 211 is also coupled to the circuit reference voltage node (e.g., circuit ground).

In operation, the voltage-to-current converter circuit has two modes of operation. When the clock frequency is less than the data frequency, the circuit operates in a frequency up mode to cause the VCO frequency to increase. When the clock frequency is greater than the data frequency, the circuit 105 operates in a frequency down mode to cause the VCO frequency to decrease.

In the frequency up mode, when the input data rate is higher than the VCO frequency, frequency control voltage signal Q3 is at logical "1". Transistors 224, 225, 201 are ON while transistors 206, 220, 221, 222, 223 are OFF. When switch circuit control signal Q2 goes low, transistor 202 is ON while transistor 204 is OFF. The current signal output from the voltage-to-current converter circuit 105 (i.e., conversion of logical high Q3 voltage) will charge the following filter (e.g., loop filter) and the VCO frequency increases.

The total latency of signal Q2 through the voltage-to-current converter circuit 105 is only the delay of transistor 202. This means the frequency capture range in the frequency up mode is approximately four times of that in prior art. When signal Q2 goes high, transistor 202 is OFF while transistor 204 is ON. Through transistor 204, the drain voltage of transistor 201 is at a bias voltage approximately half of the supply voltage (e.g., $V_{DD}/2$). This bias voltage is generated with the two series connected resistances R1 210 and R2 211, between the power supply node at $V_{DD}$ and the circuit reference voltage node at circuit ground potential. Keeping the second series circuit at $V_{DD}/2$ keeps transistor 201 on when the voltage-to-current converter circuit turns off and reduces the time required to eventually go to the expected voltage at the output when the voltage-to-current converter circuit turns on. This can help to further reduce the latency of signal Q2 by reducing the setup time of current in transistor 201.

In the frequency down mode, when the input data rate is lower than the VCO frequency, frequency control voltage signal Q3 is at logical "0". Transistors 201, 224, 225 are OFF while transistors 206, 220, 221, 222, 223, are ON. When switch circuit control signal Q2 goes low, transistor 203 is ON while transistor 205 is OFF. The current signal output of the voltage-to-current converter circuit 105 will discharge the following filter. Thus, the VCO frequency will decrease to match the slower data rate.

The total latency of Q2 is only the delay of transistor 203. This means the frequency capture range in the frequency down mode is approximately six times of that in prior art. When Q2 goes high, transistor 203 is OFF while transistor 205 is ON. Through transistor 205, the drain voltage of transistor 206 is at a bias voltage that is approximately half the supply voltage (e.g., $V_{DD}/2$). The bias voltage is generated by the two series connected resistances R1 210 and R2 211, between the power supply voltage and the circuit ground reference voltage, acting at a voltage divider circuit. This can help to further reduce the latency of Q2 by reducing the setup time of current in transistor 206.

The latency of signal Q2 determines the minimum allowed pulse width of Q2 as well as the maximum allowed difference between the input data rate and the VCO frequency (i.e., the frequency capture range). It can be seen that in both the frequency up mode and the frequency down mode, the latency of Q2 is the same. In both cases the latency is one transistor delay. This is unlike the prior art where the latency for Q2 is not only greater (e.g., the sum of multiple transistors) but it is not symmetrical. Conventionally, the Q2 latency is greater for the frequency down mode as compared to the frequency up mode. Thus, the conventional frequency capture ranges are substantially less than the disclosed embodiments as well as being different between the frequency up mode and the frequency down mode.

Figure 3B:
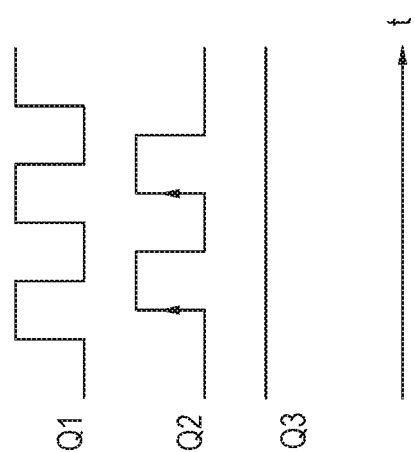
FIGS. 3A, 3B illustrate plots of operational signals of the reference-less frequency detector, according to the embodiment of FIG. 1.
Figure 3A:
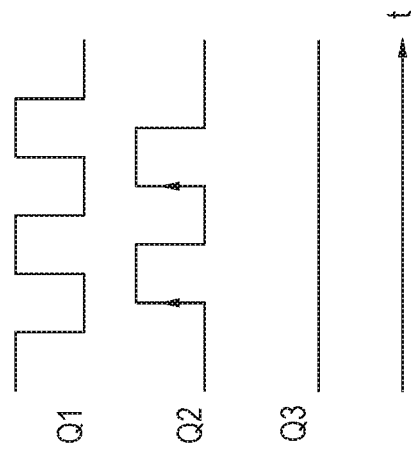

FIGS. 3A, 3B illustrate plots of operational signals of the reference-less frequency detector, according to the embodiment of FIG. 1. The plot of FIG. 3A shows the case where the data rate is greater than the VCO frequency. In this case, the signal Q3 is at a logical high. The plot of FIG. 3B shows the case where the data rate is less than the VCO frequency. In this case, the signal Q3 is at a logical low.

Figure 4:
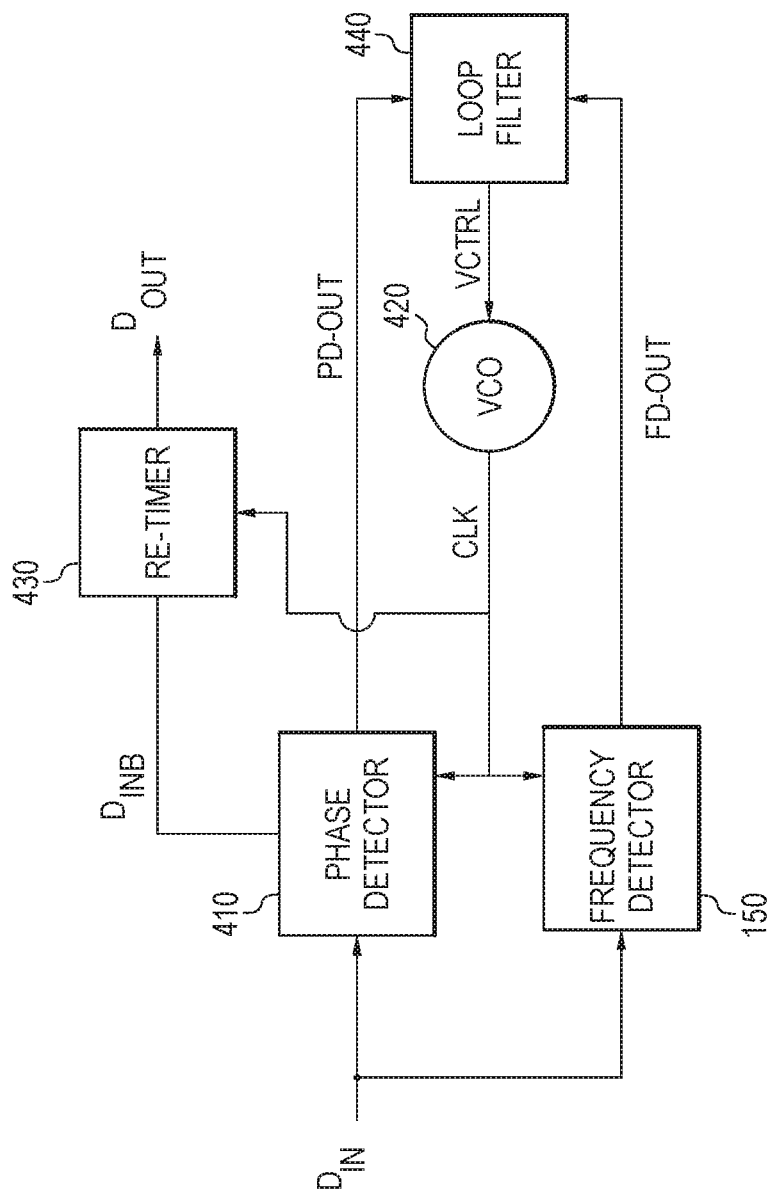
FIG. 4 illustrates a block diagram of a clock/data recovery system including a reference-less frequency detector, according to various embodiments.

FIG. 4 illustrates a block diagram of a clock/data recovery system including a reference-less frequency detector, according to various embodiments. The clock/data recovery system may be used for synchronizing an input data signal ($D_{IN}$) with a VCO 420 in order to recover the data transmitted via a noisy channel. This block diagram is for purposes of illustrating only one possible implementation of the disclosed embodiment of the reference-less frequency detector 150.

The system includes a phase detector 410 coupled to the input data signal $D_{IN}$. The phase detector 410 is also coupled to the clock signal CLK generated by the VCO 420. The phase detector 410 compares the phase of the data in signal $D_{IN}$ with the input clock signal CLK to generate a phase difference signal PD-OUT that is based on the phase difference between the input data signal $D_{IN}$ and the VCO clock CLK. The PD-OUT signal is input to a loop filter 440.

The phase detector 410 also outputs a buffered data signal $D_{INB}$ based on the input data signal $D_{IN}$. The input data signal $D_{IN}$ is input to the reference-less frequency detector 150 as described previously with reference to FIGS. 1 and 2. The VCO clock CLK is also input to the reference-less frequency detector 150 as described previously. The reference-less frequency detector 150 generates the frequency difference signal FD-OUT that is the up/down current signal based on the frequency difference between the input data signal $D_{IN}$ and the VCO clock CLK.

The loop filter 440 now has the phase difference signal and the frequency difference signal as inputs. The loop filter 440 can now generate the VCO control signal VCTRL that is input to the VCO 420 to adjust both the phase and the frequency of the VCO 420 to more closely align the clock signal CLK with the input data signal $D_{IN}$ in both phase and frequency.

The now phase and frequency aligned clock signal CLK is input to a re-timer circuit 430 to clock out the buffered data signal $D_{INB}$. The $D_{OUT}$ signal from the re-timer circuit 430 is the recovered data signal.

Figure 5:
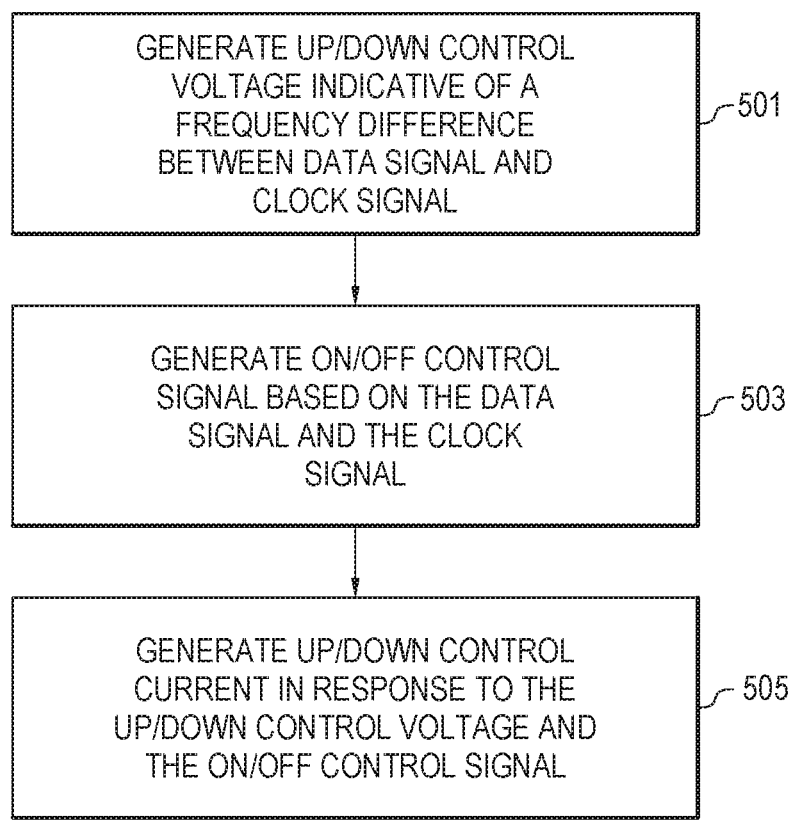
FIG. 5 illustrates a flowchart of a method for operation of the reference-less frequency detector, according to various embodiments.

FIG. 5 illustrates a flowchart of a method for operation of the reference-less frequency detector, according to various embodiments. In block 501, an up/down control voltage is generated. The up/down control voltage is indicative of a frequency difference between a data signal and a clock signal and comprises one of either an up frequency indication voltage or a down frequency indication voltage.

In block 503, an on/off control signal is generated based on the data signal and the clock signal. The on/off control signal comprises one of either an on voltage or an off voltage. In block 505, an up/down control current is generated based on the up/down control voltage and the on/off control signal. The up/down control current comprises one of either an up control current or a down control current. The on/off control signal controls an output switch circuit of a voltage-to-current converter circuit such that a voltage generation latency of the up frequency indication voltage is equal to the voltage generation latency of the down frequency indication voltage through the output switch circuit.

In one embodiment of a system for generating a frequency control signal from a reference-less frequency detector, the system includes voltage generation means for generating an up/down control voltage, wherein the up/down control voltage is indicative of a frequency difference between an input data rate and a clock frequency and comprises an up frequency indication voltage and a down frequency indication voltage. The system further includes control signal means for generating a control signal based on the data rate and the clock frequency. In one embodiment, the control signal is an on/off signal. The system further includes a current generation means for generating the frequency control current based on the up/down control voltage and the control signal, wherein the control signal controls an output switch circuit of a voltage-to-current converter circuit such that a latency of the up frequency indication voltage is equal to a latency of the down frequency indication voltage through the output switch circuit.

One embodiment of the above system includes a voltage converter means for converting a voltage to a current, the voltage converter means operating in a frequency up mode based on the input data rate being greater than the clock signal frequency and, alternatively, in a frequency down mode based on the input data rate being less than the clock signal frequency.

Further aspects and embodiments of the invention are described in the following clauses.

Clause 1. A reference-less frequency detector circuit comprising:
a sampling circuit configured to generate a frequency control voltage and a switch circuit control signal based on a frequency difference between a clock signal frequency and an input data rate, the frequency control voltage comprising a frequency down indication and a frequency up indication; and
a voltage-to-current converter circuit coupled to the sampling circuit and configured to convert the frequency control voltage to a frequency control current based on the switch circuit control signal, the voltage-to-current converter circuit comprising an output switch circuit controlled by the switch control signal and configured to have substantially equal respective latencies for the frequency down indication and the frequency up indication.

Clause 2. The circuit of clause 1, wherein the output switching circuit comprises:
a first series circuit comprising first and second transistors coupled in series with each other and having a complementary type with each other, a gate of the first transistor coupled to the output of the sampling circuit and a gate of the second transistor coupled to an inverse of the output of the sampling circuit, wherein an output node for the output switching circuit is a common node between the first and second transistors;
a second series circuit comprising third and fourth transistors coupled in series with each other and having a complementary type with each other, a gate of the third transistor coupled to the inverse of the output of the sampling circuit and a gate of the fourth transistor coupled to the output of the sampling circuit, wherein the first and second series circuits are coupled together in parallel at first and second common nodes;
a fifth transistor coupled between a supply node and the first common node:
a sixth transistor coupled between a circuit reference node and the second common node; and
a voltage divider network coupled between the supply node and the circuit reference node, the voltage divider network configured to provide a voltage to a common node between the third and fourth transistors.

Clause 3. The circuit of any one of clauses 1-2, wherein the circuit reference node is circuit ground.

Clause 4. The circuit of any one of clauses 1-3, wherein the first and third transistors are p-type field effect transistors (PFETs) and the second and fourth transistors are NFETs.

Clause 5. The circuit any one of clauses 1-4, wherein the voltage-to-current converter circuit comprises:
a first pair of transistors coupled in series with each other and having a complementary type with each other, wherein a gate of one of the first pair of transistors is coupled to an output of a sampling circuit and configured to operate in response to a first state of the frequency control voltage;
a second pair of transistors coupled in series with each other and having a complementary type with each other, wherein a gate of one of the second pair of transistors is coupled to the output of the sampling circuit and configured to operate in response to a second state of the frequency control voltage, the second state being an inverse of the first state, wherein the first and second pair of transistors are coupled in parallel at a first common node and a second common node, the first common node coupled to the supply node; and
a current source coupled between the circuit reference node and the second common node.

Clause 6. The circuit of any one of clauses 1-5, wherein remaining transistors of the first and second pairs of transistors are each coupled in a diode configuration and coupled to the supply node.

Clause 7. The circuit of any one of clauses 1-6, wherein a gate of the fifth transistor is coupled to a gate of the remaining transistor of the second pair of transistors.

Clause 8. The circuit of any one of clauses 1-7, wherein the substantially equal respective latencies for the frequency down indication and the frequency up indication are each based on a one transistor latency.

Clause 9. The circuit of any one of clauses 1-8, wherein the one transistor latency for the frequency up indication comprises the first transistor and the one transistor latency for the frequency down indication comprises the second transistor.

Clause 10. A clock/data recovery system comprising:
a voltage controlled oscillator configured to generate a clock signal;
a phase detector coupled to the voltage controlled oscillator and configured to generate a buffered data signal and a phase difference control signal based on an input data signal and the clock signal, wherein the phase difference control signal is indicative of a phase difference between the clock signal and the input data signal;
a reference-less frequency detector coupled to the voltage controlled oscillator and configured to generate a frequency difference control signal indicative of a frequency difference between the input data signal and the clock signal, the frequency detector comprising:

a sampling circuit configured to generate a frequency control voltage and a switch circuit control signal based on the frequency difference between the clock signal and the input data signal, the frequency control voltage comprising a frequency down indication and a frequency up indication; and a voltage-to-current converter circuit coupled to the sampling circuit and configured to convert the frequency control voltage to a frequency control current in response to the switch circuit control signal, the voltage-to-current converter circuit comprising an output switch circuit controlled by the switch control signal and configured to have substantially equal respective latencies for the frequency down indication and the frequency up indication; and a filter coupled to the phase detector and the frequency detector and configured to output a control signal to the voltage controlled oscillator, wherein the control signal provides an indication of a phase difference and a frequency difference between the input data signal and the clock signal.

Clause 11. The system of clause 10, further comprising a re-timer circuit coupled to the voltage controlled oscillator and the phase detector, the re-timer circuit configured to clock out the buffered data signal in response to the clock signal.

Clause 12. The system of any one of clauses 10-11, wherein the switch circuit control signal is coupled to one transistor, having a first transistor latency, to generate the frequency up indication and one transistor, having a second transistor latency, to generate the frequency down indication, wherein the first and second transistor latencies are the same.

Clause 13. The system of any one of clauses 10-12, wherein the sampling circuit comprises a first flip-flop, having a data input coupled to the clock signal and a clock input coupled to the delayed data signal, to generate the switch circuit control signal.

Clause 14. The system of any one of clauses 10-13, wherein the sampling circuit further comprises a second flip-flop coupled in series with a third flip-flop, the second flip-flop having a data input coupled to the clock signal and a clock input coupled to the input data signal, the third flip-flop having a data input coupled to an output of the second flip-flop and a clock input coupled to an output of the first flip-flop.

Clause 15. A method for generating a frequency control signal from a reference-less frequency detector, the method comprising:

generating an up/down control voltage, wherein the up/down control voltage is indicative of a frequency difference between an input data rate and a clock frequency and comprises an up frequency indication voltage and a down frequency indication voltage:

generating a control signal based on the data rate and the clock frequency; and generating the frequency control current based on the up/down control voltage and the on/off control signal, wherein the on/off control signal controls an output switch circuit of a voltage-to-current converter circuit such that a latency of the up frequency indication voltage is equal to a latency of the down frequency indication voltage through the output switch circuit.

Clause 16. The method of clause 15 wherein the control signal is an on/off control signal.

Clause 17. The method of any one of clauses 15-16, further comprising a voltage-to-current converter circuit operating in a frequency up mode based on the input data rate being greater than the clock signal frequency.

Clause 18. The method of any one of clauses 15-17, further comprising the voltage-to-current converter circuit operating in a frequency down mode based on the input data rate being less than the clock signal frequency.

Clause 19. The method of any one of clauses 15-18, further comprising:

the on/off control signal turning on a first transistor, having a first latency, in the output switch circuit to generate the frequency control current based on the up/down control voltage; and the on/off control signal turning on a second transistor, having a second latency, in the output switch circuit to generate the frequency control current based on the up/down control voltage, wherein the first latency and the second latency are equal.

Clause 20. The method of any one of clauses 15-19, further comprising increasing the clock frequency of the voltage controlled oscillator based on the up frequency indication voltage and decreasing the clock frequency of the voltage controlled oscillator based on the down frequency indication voltage.

Clause 21. The method of any one of clauses 15-20, further comprising the frequency control current charging a loop filter to increase the clock frequency and the frequency control current discharging the loop filter to decrease the clock frequency.

In the previous description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software in one embodiment. The software may consist of computer executable instructions stored on computer readable media or computer readable storage device such as one or more non-transitory memories or other type of hardware based storage devices, either local or networked. Further, such functions correspond to modules, which may be software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system, turning such computer system into a specifically programmed machine.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. A reference-less frequency detector circuit, comprising:
   a sampling circuit configured to generate a frequency control voltage and a switch circuit control signal based on a frequency difference between a clock signal frequency and an input data rate, the frequency control voltage comprising a frequency down indication and a frequency up indication; and
   a voltage-to-current converter circuit coupled to the sampling circuit and configured to convert the frequency control voltage to a frequency control current based on the switch circuit control signal, the voltage-to-current converter circuit comprising an output switching circuit controlled by the switch control signal and configured to have substantially equal respective latencies for the frequency down indication and the frequency up indication,
   wherein the output switching circuit comprises first and second transistors coupled in series with each other and having a complementary type with each other, wherein an output node for the output switching circuit is a common node between the first and second transistors.

2. The circuit of claim 1, wherein the output switching circuit further comprises:
   a first series circuit comprising the first and second transistors, a gate of the first transistor coupled to the output of the sampling circuit, and a gate of the second transistor coupled to an inverse of the output of the sampling circuit;
   a second series circuit comprising third and fourth transistors coupled in series with each other and having a complementary type with each other, a gate of the third transistor coupled to the inverse of the output of the sampling circuit, and a gate of the fourth transistor coupled to the output of the sampling circuit, wherein the first and second series circuits are coupled together in parallel at first and second common nodes;
   a fifth transistor coupled between a supply node and the first common node;
   a sixth transistor coupled between a circuit reference node and the second common node; and
   a voltage divider network coupled between the supply node and the circuit reference node, the voltage divider network configured to provide a voltage to a common node between the third and fourth transistors.

3. The circuit of claim 2, wherein the circuit reference node is circuit ground.

4. The circuit of claim 2, wherein the first and third transistors are p-type field effect transistors (PFETs), and the second and fourth transistors are n-type field effect transistors (NFETs).

5. The circuit of claim 2, wherein the voltage-to-current converter circuit further comprises:
   a first pair of transistors coupled in series with each other and having a complementary type with each other, wherein a gate of one of the first pair of transistors is coupled to an output of a sampling circuit and configured to operate in response to a first state of the frequency control voltage;
   a second pair of transistors coupled in series with each other and having a complementary type with each other, wherein a gate of one of the second pair of transistors is coupled to the output of the sampling circuit and configured to operate in response to a second state of the frequency control voltage, the second state being an inverse of the first state, wherein the first and second pair of transistors are coupled in parallel at a first common node and a second common node, the first common node coupled to the supply node; and
   a current source coupled between the circuit reference node and the second common node.

6. The circuit of claim 5, wherein remaining transistors of the first and second pairs of transistors are each coupled in a diode configuration and coupled to the supply node.

7. The circuit of claim 6, wherein a gate of the fifth transistor is coupled to a gate of the remaining transistor of the second pair of transistors.

8. The circuit of claim 2, wherein the substantially equal respective latencies for the frequency down indication and the frequency up indication are each based on a one transistor latency.

9. The circuit of claim 8, wherein the one transistor latency for the frequency up indication comprises the first transistor and the one transistor latency for the frequency down indication comprises the second transistor.

10. A clock/data recovery system, comprising:
    a voltage controlled oscillator configured to generate a clock signal;
    a phase detector coupled to the voltage controlled oscillator and configured to generate a buffered data signal and a phase difference control signal based on an input data signal and the clock signal, wherein the phase difference control signal is indicative of a phase difference between the clock signal and the input data signal;
    a reference-less frequency detector coupled to the voltage controlled oscillator and configured to generate a frequency difference control signal indicative of a frequency difference between the input data signal and the clock signal, the reference-less frequency detector comprising:
      a sampling circuit configured to generate a frequency control voltage and a switch circuit control signal based on the frequency difference between the clock signal and the input data signal, the frequency control voltage comprising a frequency down indication and a frequency up indication; and
      a voltage-to-current converter circuit coupled to the sampling circuit and configured to convert the frequency control voltage to a frequency control current in response to the switch circuit control signal, the voltage-to-current converter circuit comprising an output switch circuit controlled by the switch control signal and configured to have substantially equal respective latencies for the frequency down indication and the frequency up indication; and
    a filter coupled to the phase detector and the reference-less frequency detector and configured to output a control signal to the voltage controlled oscillator, wherein the control signal provides an indication of a phase difference and a frequency difference between the input data signal and the clock signal.

11. The system of claim 10, further comprising a re-timer circuit coupled to the voltage controlled oscillator and the phase detector, the re-timer circuit configured to clock out the buffered data signal in response to the clock signal.

12. The system of claim 10, wherein the switch circuit control signal is coupled to one transistor, having a first transistor latency, to generate the frequency up indication and one transistor, having a second transistor latency, to generate the frequency down indication, wherein the first and second transistor latencies are the same.

13. The system of claim 10, wherein the sampling circuit comprises a first flip-flop, having a data input coupled to the clock signal and a clock input coupled to the delayed data signal, to generate the switch circuit control signal.

14. The system of claim 13, wherein the sampling circuit further comprises a second flip-flop coupled in series with a third flip-flop, the second flip-flop having a data input coupled to the clock signal and a clock input coupled to the input data signal, the third flip-flop having a data input coupled to an output of the second flip-flop and a clock input coupled to an output of the first flip-flop.

15. A method for generating a frequency control signal from a reference-less frequency detector, the method comprising:
generating an up/down control voltage, wherein the up/down control voltage is indicative of a frequency difference between an input data rate and a clock signal frequency, and comprises an up frequency indication voltage or a down frequency indication voltage;
generating a control signal based on the data rate and the clock frequency;
generating the frequency control current based on the up/down control voltage and the on/off control signal, wherein the on/off control signal controls an output switch circuit of a voltage-to-current converter circuit such that a latency of the up frequency indication voltage is equal to a latency of the down frequency indication voltage through the output switch circuit; and
in response to detecting the input data rate is greater than the clock signal frequency, configuring the voltage-to-current converter circuit to operate in a frequency up mode.

16. The method of claim 15, wherein the control signal is an on/off control signal.

17. The method of claim 15, further comprising:
in response to detecting the input data rate is less than the clock signal frequency, configuring the voltage-to-current converter circuit to operate in a frequency down mode.

18. The method of claim 17, further comprising:
turning on a first transistor in the output switch circuit using the control signal, the first transistor having a first latency, to generate the frequency control current based on the up/down control voltage; and
turning on a second transistor in the output switch circuit using the control signal, the second transistor having a second latency, to generate the frequency control current based on the up/down control voltage, wherein the first latency and the second latency are equal.

19. The method of claim 15, further comprising:
increasing the clock frequency of the voltage controlled oscillator based on the up frequency indication voltage, and decreasing the clock frequency of the voltage controlled oscillator based on the down frequency indication voltage.

20. The method of claim 19, further comprising:
performing one of charging a loop filter using the frequency control current to increase the clock frequency, or discharging the loop filter using the frequency control current to decrease the clock frequency.

* * * * *

UNITED STATES PATENT AND TRADEMARK OFFICE
CERTIFICATE OF CORRECTION

PATENT NO. : 10,097,190 B2  
APPLICATION NO. : 15/394506  
DATED : October 9, 2018  
INVENTOR(S) : Gu et al.

Page 1 of 1

It is certified that error appears in the above-identified patent and that said Letters Patent is hereby corrected as shown below:

In the Drawings

Sheet 2 of 5, Fig. 2, delete "VDD" and insert --$V_{DD}$-- therefor

In the Specification

In Column 3, Line 61, delete "$\overline{Q_2}$ and $\overline{Q_3}$" and insert --$\overline{Q2}$ and $\overline{Q3}$-- therefor In Column 4, Line 34, delete "$\overline{Q_3}$" and insert --$\overline{Q3}$-- therefor In Column 4, Line 35, delete "Q₃" and insert --Q3-- therefor In Column 4, Line 36, delete "Q₃" and insert --Q3-- therefor In Column 4, Line 37, delete "Q₃" and insert --Q3-- therefor In Column 5, Line 6, delete "$\overline{Q_2}$" and insert --$\overline{Q2}$-- therefor In Column 8, Line 10, delete "node:" and insert --node;-- therefor Signed and Sealed this  
Eleventh Day of June, 2019

Andrei Iancu  
*Director of the United States Patent and Trademark Office*